United States Patent [19]

Vasile

[11] Patent Number: 5,061,903
[45] Date of Patent: Oct. 29, 1991

[54] HIGH VOLTAGE MODIFIED CASCODE CIRCUIT

[75] Inventor: Carmine F. Vasile, Medford, N.Y.

[73] Assignee: Grumman Aerospace Corporation, Bethpage, N.Y.

[21] Appl. No.: 488,720

[22] Filed: Feb. 27, 1990

[51] Int. Cl.$^5$ .......................... H03F 3/68; H03F 3/16
[52] U.S. Cl. .................................... 330/311; 330/277
[58] Field of Search .............. 330/277, 286, 295, 299, 330/300, 296, 311

[56] References Cited

U.S. PATENT DOCUMENTS

| | | | |
|---|---|---|---|
| 3,609,412 | 9/1971 | Okumura | 330/277 X |
| 4,342,967 | 8/1982 | Regan et al. | 330/277 |
| 4,658,220 | 4/1987 | Heston et al. | 330/277 |
| 4,760,350 | 7/1988 | Ayasli | 330/277 X |

Primary Examiner—Steven Mottola
Attorney, Agent, or Firm—Pollock, VandeSande & Priddy

[57] ABSTRACT

A new type of high voltage FET circuit has been developed which offers a dramatic improvement in performance as compared to a common source amplifier stage. The new circuit offers inherent performance advantages in both MIC and MMIC power amplifiers. To achieve this end, the FET circuit has a common source FET connected to a common gate FET, with the common source FET having a width substantially greater than that of the common gate FET such that the common source FET does not saturate even when the common gate FET is turned fully on. To provide biasing for the circuit such that its breakdown voltage can be substantially increased, a RC circuit including a connected in parallel diode is used.

16 Claims, 7 Drawing Sheets

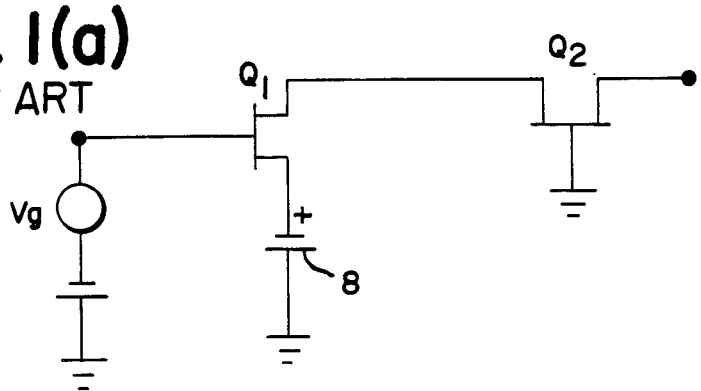
FIG. I(a) PRIOR ART
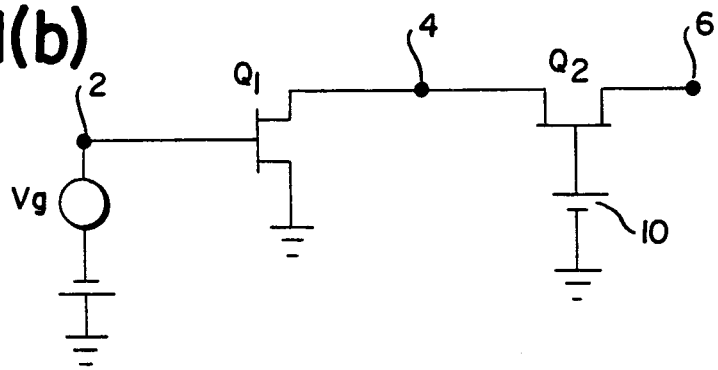
FIG.I(b)
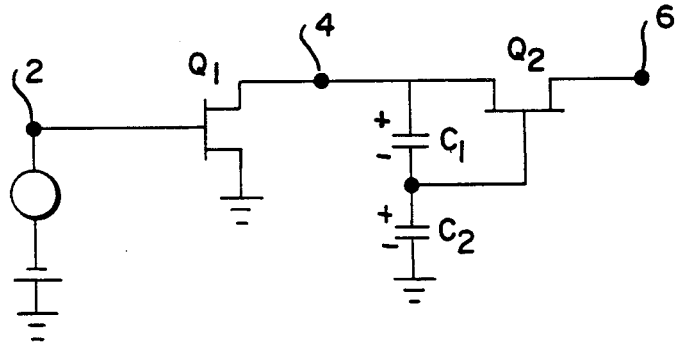
FIG.I(c)
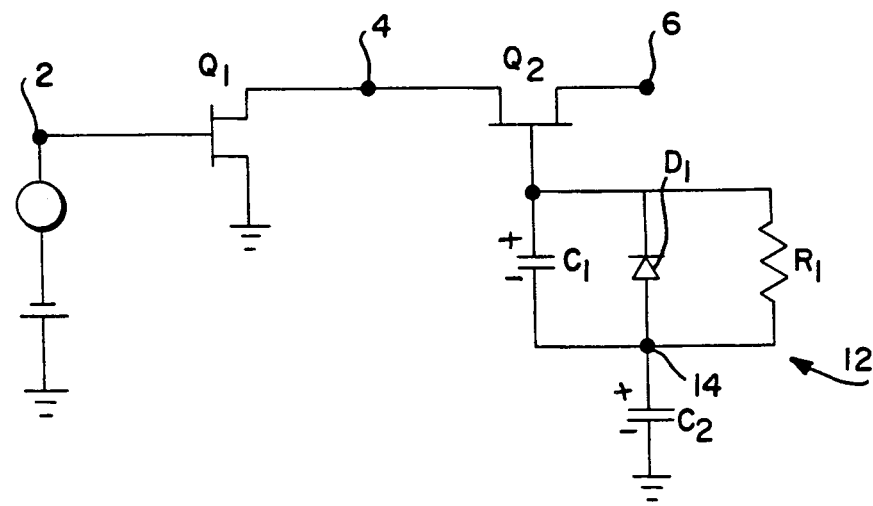
FIG.I(d)

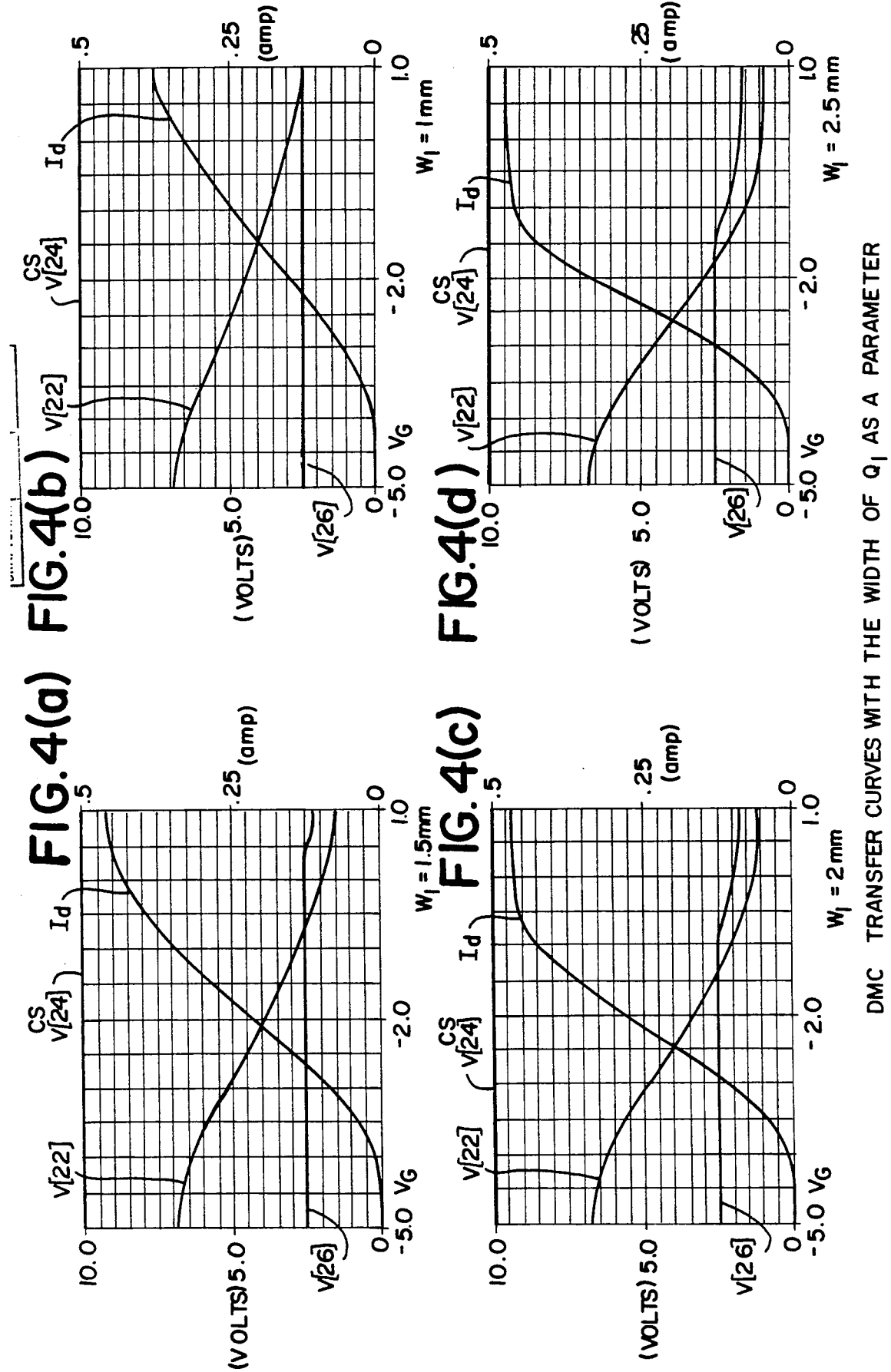
DMC TRANSFER CURVES WITH THE WIDTH OF $Q_1$ AS A PARAMETER

| IDSS mA | gm* mS | Vd·MAX VOLTS | Vdc, VOLTS | PAC, WATTS | PDC, WATTS | EFF, % | RL, OHMS | AV, dB | ΔTj, °C |
|---|---|---|---|---|---|---|---|---|---|
| CS | | | | g⊣⌐d ⏚ | W=1mm, Vp=-4, VB=20, (60° C/W/mm, t=100μ) | | | | |
| 300 | 75 | 16 / 12 | 9 / 7 | 0.52 / 0.38 | 1.35 / 0.695 | 39 / 54 | 47 / 33 | 10.9 / 1.9 | 81 / 42 |
| DMC (MMIC) | | 1.5mm | | g⊣⌐⏄⌐d ⏚ ⏚ | 1mm | | | | CS/CG |
| 300 | 112 | 32 / 28 | 17.5 / 15.5 | 1.08 / 0.94 | 2.65 / 1.48 | 41 / 63 | 97 / 83 | 17.2 / 9.9 | 70/54 / 31/43 |
| DMC (MIC) | | 2mm | | g⊣⌐⏄⌐d ⏚ ⏚ | 1mm | | | | |
| 300 | 150 | 32 / 28 | 17.5 / 15.5 | 1.08 / 0.94 | 2.65 / 1.48 | 41 / 63 | 97 / 83 | 17.2 / 9.9 | 52/54 / 23/43 |
| EQUAL CLASS A POWER | | 2mm | | g⊣⌐d ⏚ | | | | | |
| 600 | 150 | 16 / 12 | 9 / 7 | 1.04 / 0.76 | 2.7 / 1.4 | 39 / 54 | 24 / 16 | 10.9 / 1.9 | 81 / 42 |
| EQUAL CLASS B POWER & TOTAL GATE WIDTH (MMIC DMC) | | 2.5 mm | | g⊣⌐d ⏚ | | | | | |
| 750 | 188 | 16 / 12 | 9 / 7 | 1.30 / 0.95 | 3.38 / 1.74 | 39 / 54 | 19 / 13 | 10.9 / 1.9 | 81 / 42 |
| EQUAL GATE WIDTH (MIC DMC) | | 3mm | | g⊣⌐d ⏚ | | | | | |
| 900 | 225 | 16 / 12 | 9 / 7 | 1.56 / 1.04 | 4.05 / 2.09 | 39 / 54 | 16 / 11 | 10.9 / 1.9 | 81 / 42 |
| *gm AT IDSS/2 | | | | | | | | | |

DMC COMMON SOURCE COMPARISON, CLASS A & B

FIG. 6

HIGH VOLTAGE MODIFIED CASCODE CIRCUIT

FIELD OF INVENTION

The present invention relates to cascode circuits and more particularly to a new modified cascode circuit which offers dramatic improvements in performance, when compared to a conventional common source amplifier stage.

BACKGROUND OF INVENTION

In conventional cascode circuits wherein two FETs are connected—with one FET acting as the driver while the other FET acting as the output, both FETs are of the same size. In other words, both the driver and the output FETs have the same saturation current. As a consequence, the performance of the cascode circuit becomes dependent on when the driver FET becomes current saturated. This in turn means that the maximum output power available in the output FET is not being utilized.

BRIEF DESCRIPTION OF THE PRESENT INVENTION

In copending application Ser. No. 485,495 entitled "A Modified Cascode Circuit," by the same inventor and assigned the same assignee as the instant invention, and incorporated herein by reference, it was disclosed that the performance of a cascode circuit can be improved substantially where the width of the driver FET is sufficiently increased over the width of the output FET such that the driver FET does not saturate even when the output FET is fully turned on.

The present invention improves on the modified cascode circuit by providing forward biasing to the same such that further enhancement of performance results. To achieve this end, the present invention cascode circuit also has a driver FET connected to an output FET, with the gate width (size) of the driver FET being sufficiently greater than that of the output FET such that current saturation is prevented in the driver FET when the output FET is fully turned on. In addition, a bias is provided to the output FET by a diode such that the output FET is saturated via the diode, so that the breakdown voltage of the output FET is substantially increased and the performance of the cascode circuit is likewise substantially enhanced over a conventional common source (or common emitter) amplifier stage.

An objective of the present invention is therefore to provide an improved modified cascode circuit whose performance reflects a substantial improvement over conventional cascode circuits.

Another objective of the present invention is to provide a cascode circuit that can be fabricated by either microwave integrated circuit (MIC) or monolithic microwave integrated circuit (MMIC) technology without having to worry about the capacitance that is inherent in the conventional cascode circuits fabricated by either of the aforenoted technologies which, prior to the instant invention, causes degradation of the performance of amplifiers which use such conventional cascode circuits.

BRIEF DESCRIPTION OF THE FIGURES

The above-mentioned objects and advantages of the present invention will become more apparent and the invention itself will be best understood by reference to the following description of the invention taken in conjunction with the accompanying drawings, wherein.

Figure 1E:
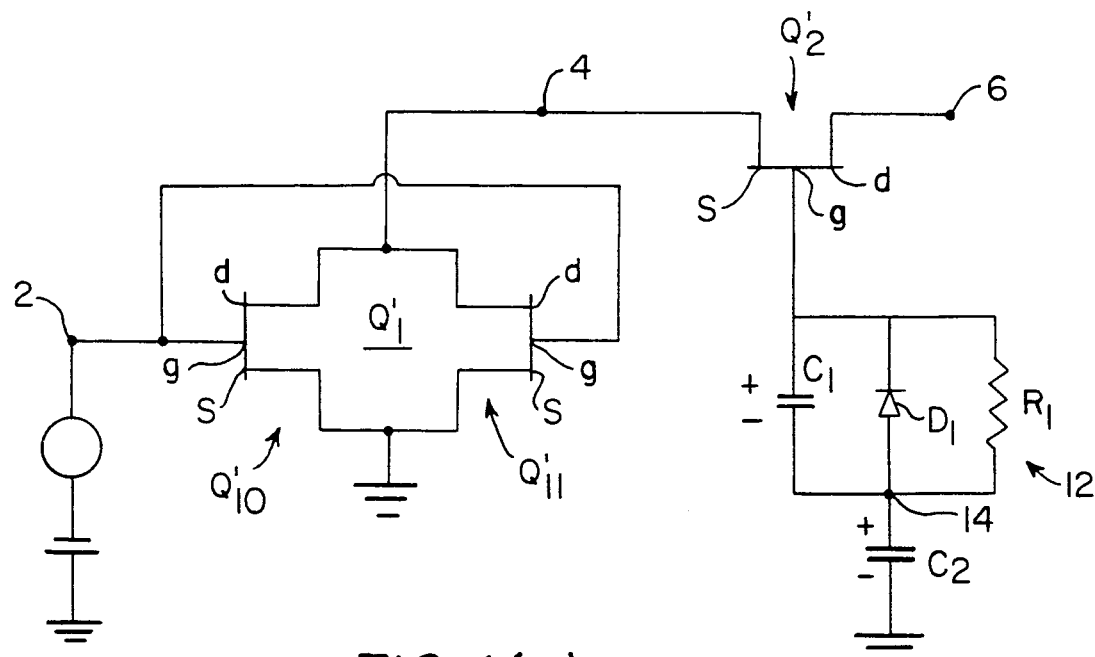
FIG. 1a is a simplified schematic circuit of a prior art cascode circuit.
Figure 1F:
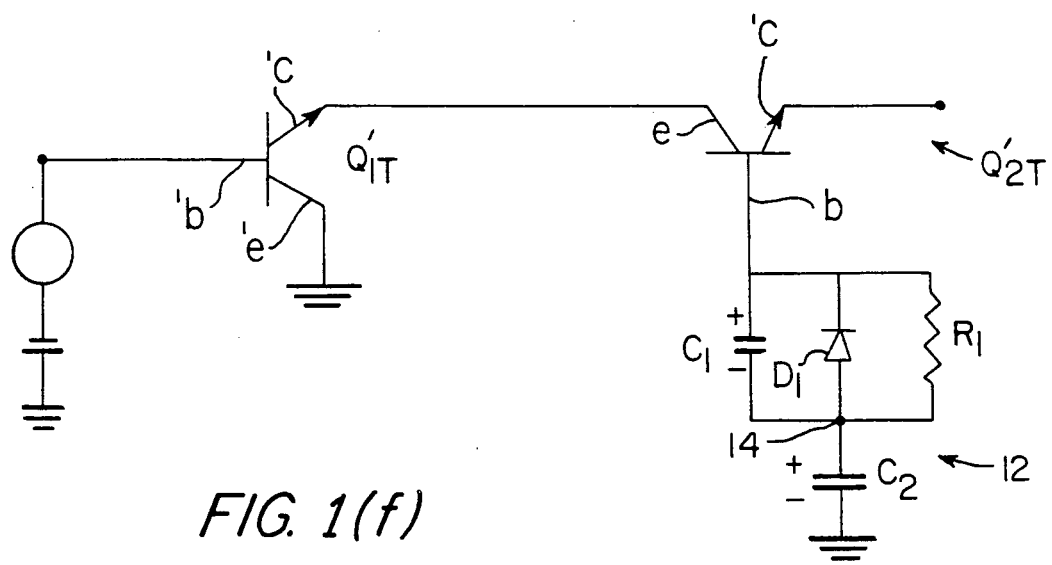
Figure 1G:
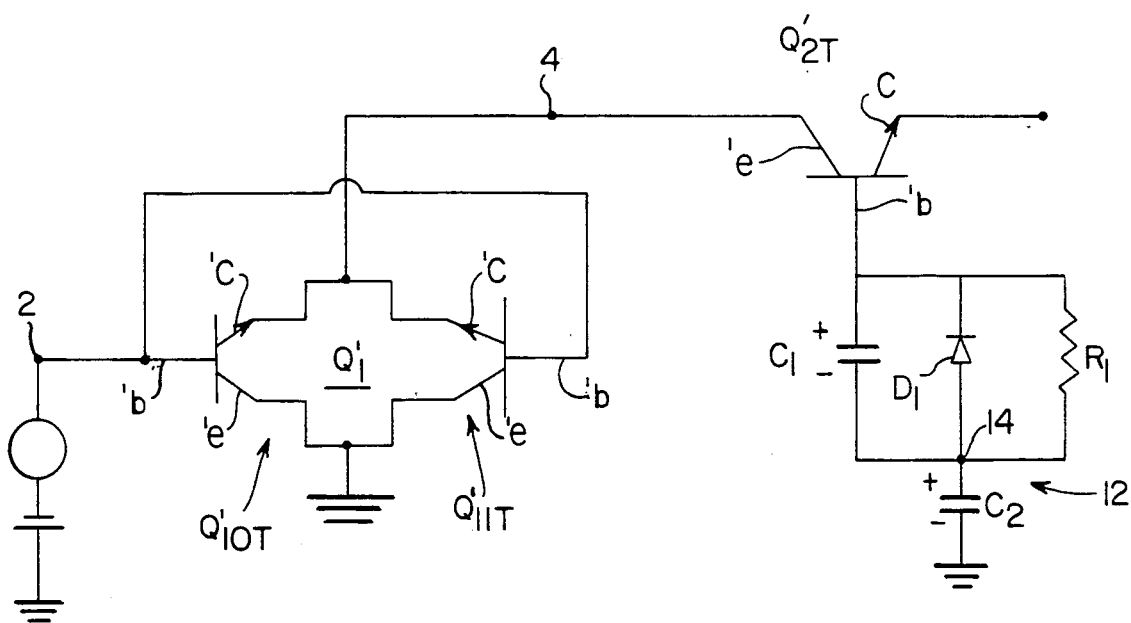
Figure 1H:
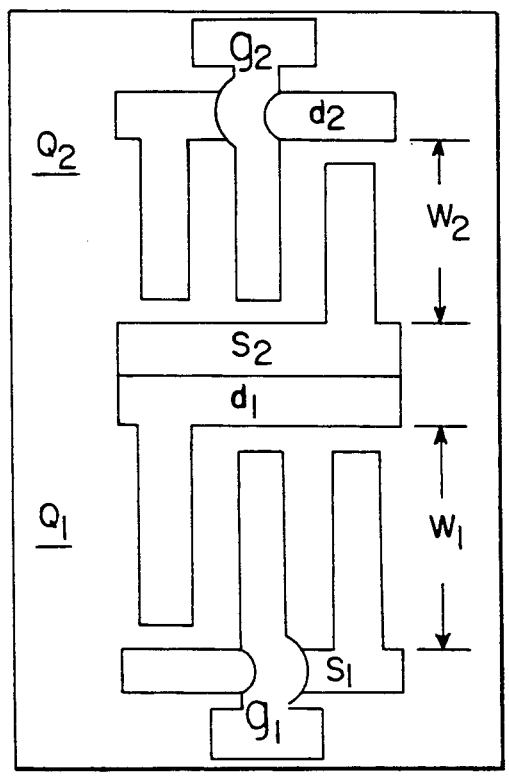
Figure 2:
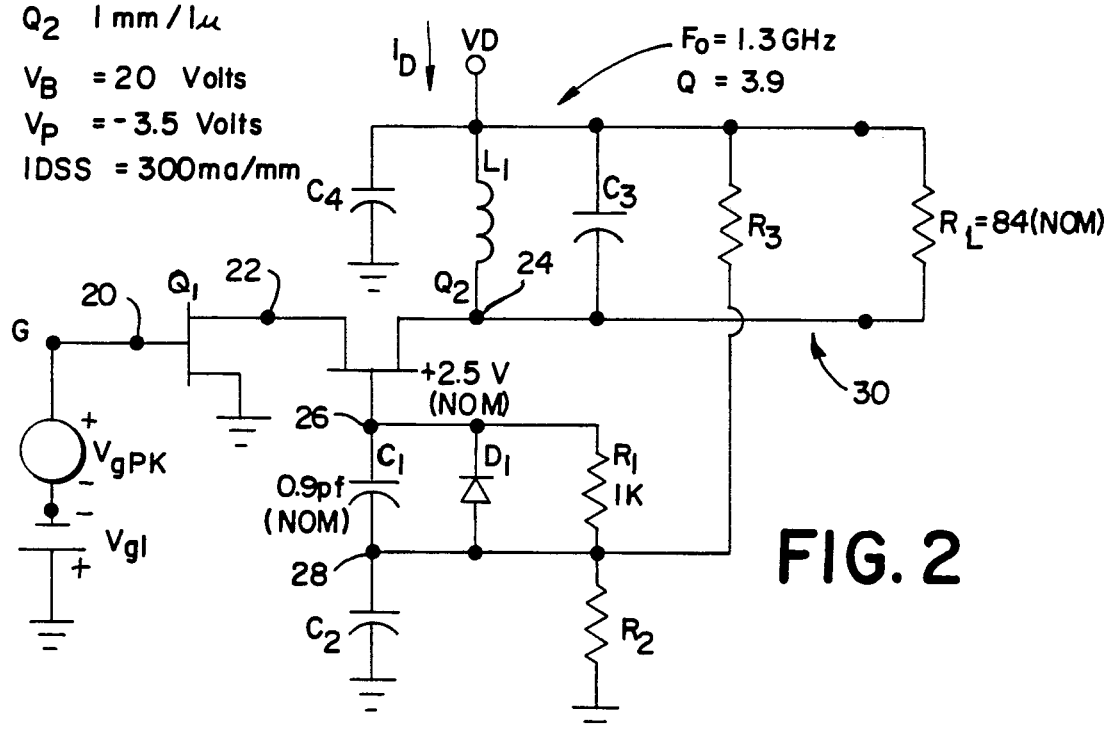
Figure 3:
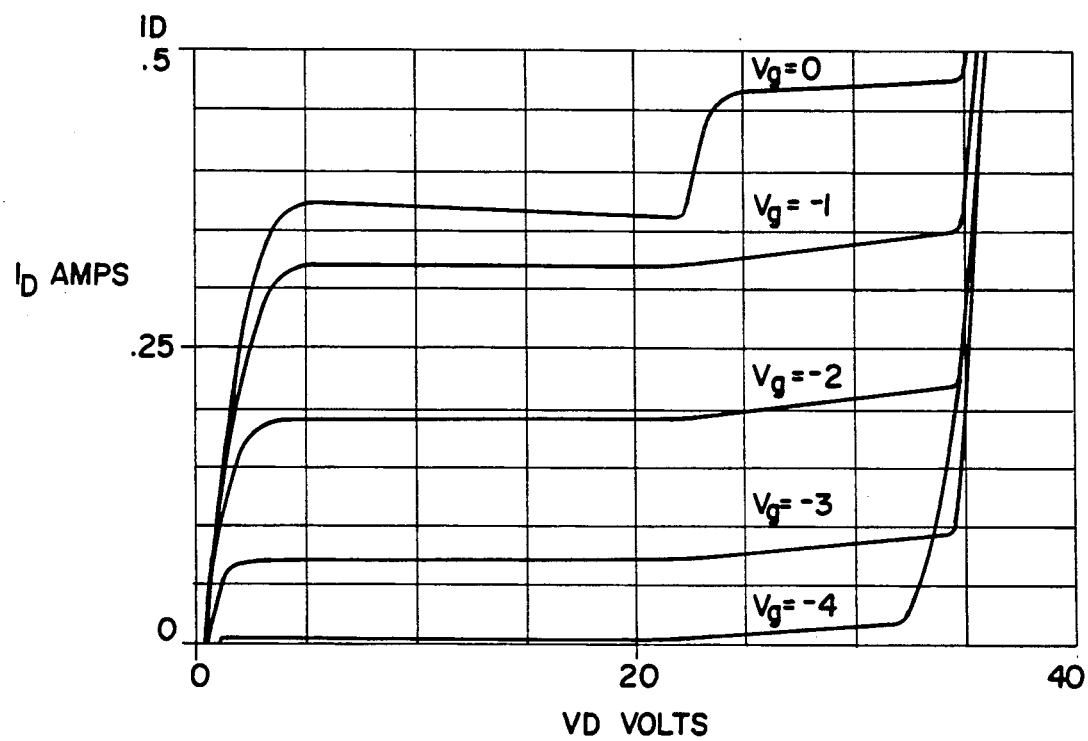
Figure 5A:
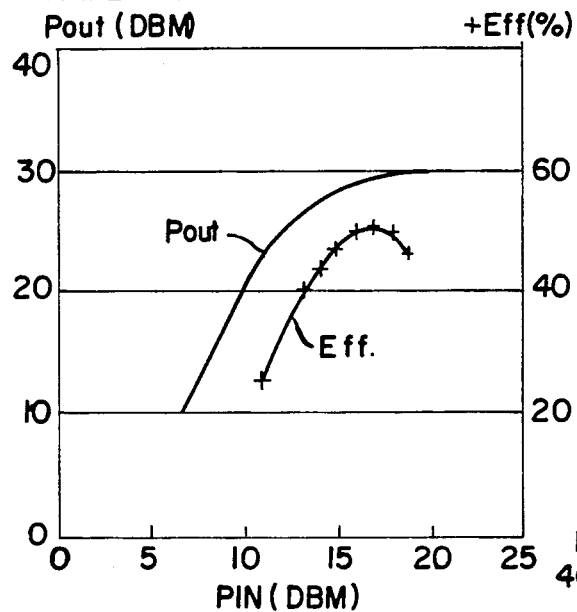
Figure 5B:
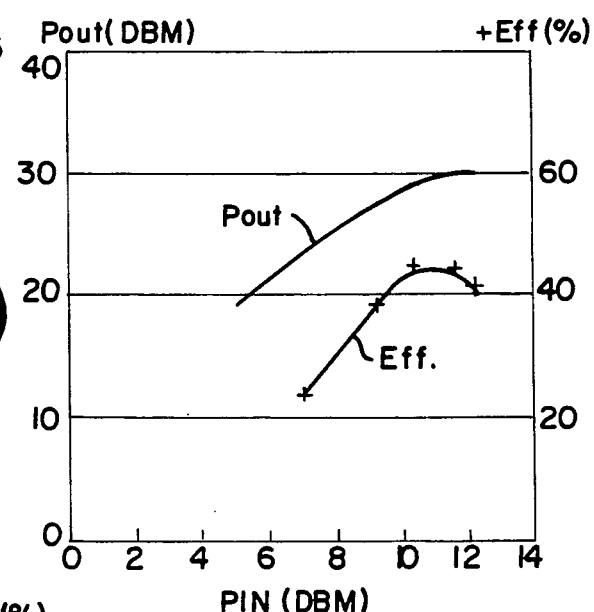
Figure 5C:
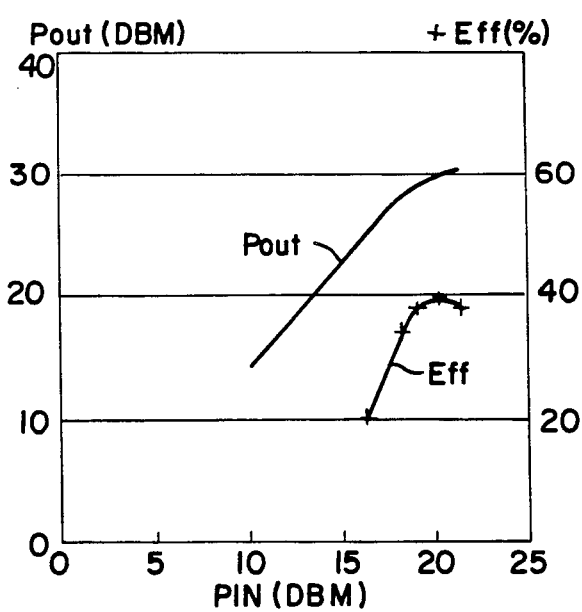

The FIG. 1b circuit shows a modified cascode circuit where the width of the gate of $Q_1$ is sufficiently greater than the width of the gate of $Q_2$ such that current saturation of $Q_1$ is prevented when $Q_2$ is turned fully on, per disclosed in the copending application;

FIG. 1c is a circuit for improving yet further improvement over the FIG. 1a circuit;

FIG. 1d is a simplified circuit of the present invention;

FIG. 1e is a simplified schematic circuit of the present invention comprising an input stage having two parallel-connected FETs;

FIG. 1f is a simplified circuit of the present invention, corresponding to FIG. 1d, in which the FETs have been replaced by bipolar junction transistors;

FIG. 1g is a schematic corresponding to FIG. 1e, but in which the FETs have been replaced by bipolar junction transistors;

FIG. 1h is a plan view of a semiconductor substrate having fabricated thereon the different gate, drain and source regions of the FIG. 1d devices;

FIG. 2 is an amplifier circuit of the present invention;

FIG. 3 is a graph showing simulated static I–V curves of the present invention circuit;

FIG. 4a is a graph showing the transfer curves of the present invention circuit with the width of the driver FET being 1.5 millimeters (mm);

FIG. 4b is a graph showing the transfer curves of a conventional cascode circuit;

FIG. 4c is a graph showing the transfer curves of the present invention cascode circuit whose driver FET has a width of 2 mm;

FIG. 4d is a graph showing the transfer curves of a circuit according to the present invention whose driver FET has a width of 2.5 mm;

FIG. 5a is a graph showing the power output curve and the efficiency of a Class B one (1) watt amplifier which utilizes the cascode circuit of the present invention;

FIG. 5b is a graph showing the power and efficiency curves of a Class AB one (1) watt amplifier which utilizes the cascode circuit of the present invention;

FIG. 5c is a graph showing the power and efficiency curves of a Class B one (1) watt amplifier which utilizes the cascode circuit of the present invention but which operates at a frequency much higher than that shown in the graph of FIG. 5a; and FIG. 6 is a table which provides comparison between the present invention cascode circuit fabricated by both MMIC and MIC technologies, and conventional cascode amplifier stages.

DETAILED DESCRIPTION OF THE PRESENT INVENTION

FIG. 1a illustrates a conventional cascode circuit which has a common source driver stage FET (transistor) $Q_1$, the drain of which is connected to the source of an output stage common gate FET (transistor) $Q_2$. To turn $Q_2$ fully on, it was thought that $Q_1$ has to be biased by approximately 2 to 4 volts from voltage source 8, given the voltage applied from voltage source $V_g$ to the gate of $Q_1$. The requirement for an extra voltage source 8 is impractical because it must carry the drain current.

To overcome the impracticality of the FIG. 1a circuit, per the FIG. 1b circuit, a biasing voltage of approximately 1.7 to 2 volts is applied to the gate of $Q_2$, so that $Q_2$ can be fully turned on when $Q_1$ is turned on and the voltage at node 4 drops to approximately 1 volt. For the FIG. 1b circuit, presuppose that $Q_2$ has a breakdown voltage of 20 volts. And because of the approximately 2 volts from bias voltage source 10, the voltage at node 6 can go up to approximately 22 volts. Therefore, assuming $Q_2$ has a pinchoff voltage of approximately 4 volts, if $V_g$ can supply $-8$ volts to $Q_1$, approximately 12 volts can be provided at node 4 when $Q_1$ is shut off and $Q_2$ is biased by voltage source 10.

Realizing that parasitic capacitance is inherent in FETs, it was thought that a capacitance divider may be set across the gate and source of $Q_2$ to force the gate of $Q_2$ to rise when $Q_1$ is turned off. This was done in the circuit of FIG. 1c which, given the same parameters as those of the FIG. 1b circuit, has 12 volts at node 4 when $Q_1$ is turned off. By arranging capacitors $C_1$ and $C_2$ of the capacitance divider such that there are 4 volts across capacitant $C_1$ and 8 volts across capacitor $C_2$, the operation of $Q_2$ would remain in sync with that of $Q_1$, i.e., $Q_2$ is automatically turned off when $Q_1$ is shut off and, conversely, $Q_2$ is automatically turned on when $Q_1$ is turned on. Given the 8 volts across capacitor $C_2$, even though the breakdown voltage of $Q_2$ remains at 20 volts, the output at node 6 now rises to 28 volts, which is a substantial increase over the conventional cascode circuit shown in FIG. 1a.

Yet a problem remains with the FIG. 1c circuit in that $Q_2$ still has to be biased. This problem is resolved by adding a diode $D_1$ and resistor R, as shown in the FIG. 1d circuit of the present invention. In addition to the modified cascode circuit where the width (size) of $Q_1$ is sufficiently greater than the width (size) of $Q_2$ such that $Q_1$ does not saturate even when $Q_2$ is turned fully on, the FIG. 1d circuit has a biasing section 12 which comprises a capacitor $C_1$ connected in parallel to diode $D_1$ and resistor $R_1$, with bypass capacitor $C_2$ connected from node 14 to ground. With the configuration of biasing section 12, diode $D_1$ provides forward biasing to the gate of $Q_2$. Also, with leakage resistor $R_1$ and a properly adjusted time constant, charges are prevented from being built up in capacitor $C_1$.

To fabricate $Q_1$ and $Q_2$ onto a single substrate, for example by using MMIC technology, the way in which the saturation current of the common source $Q_1$ may be increased over that of the common gate $Q_2$ is to have a greater width (size) between the source and drain regions of $Q_1$ than $Q_2$. For instance, with reference to the FIG. 1h plan view of a substrate having fabricated thereon the different gate, drain and source regions of the $Q_1$ and $Q_2$, it can be seen that width $W_1$ of $Q_1$ is greater than width $W_2$ of $Q_2$. Of course, width $W_1$ is sufficiently greater than width $W_2$ to enable $Q_1$ not to go into current saturation when $Q_2$ is turned fully on.

FIG. 2 illustrates a 1.3 GHz amplifier stage which is comprised of a diode modified cascode circuit cell (DMC) of the present invention and which is driven by an ideal voltage source VgPK. For the DMC of the FIG. 2 circuit, FET $Q_1$ has a gate width of 1.5 mm and FET $Q_2$ has a gate width of 1 mm. The breakdown voltage $V_B$ of FET $Q_2$ is given as 20 volts; the pinchoff voltage Vp is $-3.5$ volts; and the current IDSS is 300 ma/mm. A biasing section in the form of connected in parallel capacitor $C_1$, diode $D_1$ and resistor $R_1$ provides fixed bias to the gate of common gate stage $Q_2$. The DMC is defined by the size of $Q_2$, which was arbitrarily selected to be a 1,000×1 micron Tachonics foundry ion-implanted MESFET having the above noted parameters. The gate width (size) of the common source (or common emitter) stage $Q_1$ is selected to be large enough to prevent current saturation when turned fully on, such that $Q_2$ can be saturated via diode $D_1$ and positive voltage at node 28. The drain of $Q_1$ is directly connected to the source of $Q_2$, at L band for one micron FET technology where both $Q_1$ and $Q_2$ are fabricated on the same semiconductor substrate. Of course, additional reactive circuits can be introduced between the common source (emitter) input stage and the common gate output stage, and the DMC frequency response can be extended to microwave frequencies higher than 1.3 GHz.

It should be appreciated that $Q_1$ can be replaced by a plurality (at least two) of connected in parallel FETS (transistors) to effect a combined saturation current sufficiently greater than the saturation current of the output $Q_2$ FET, so as to ensure that the input FETs do not saturate when the output FET is turned fully on. Such a configuration is illustrated in FIG. 1e in which the input stage $Q'_1$ has been replaced by two parallel-connected FETs $Q'_{10}$ and $Q'_{11}$. As is well known, the combined saturation current of $Q'_{10}$ and $Q'_{11}$ can be made to be sufficiently greater than the saturation current of $Q'_2$ to ensure that a maximum output is provided at node 6.

The extended voltage operation of the DMC arises from two mechanisms. At DC, $R_1$ is selected large enough such that the maximum DC voltage at the drain of $Q_2$, i.e., node 24, is effectively the sum of the gate to drain breakdown voltage $V_B$ of $Q_2$, and the gate to drain breakdown voltage of $Q_1$ when $Q_1$ is turned off. For the FIG. 2 circuit, the DC breakdown voltage is approximately 36.5 volts ($2V_B+V_p$) for Class A operation and 33 volts ($2V_B+2V_P$) for Class B operation.

FIG. 3 shows simulated static current-voltage (IV) characteristics of the DMC cell which demonstrates the breakdown effect for the case of a 2.5 volt battery being connected to node 28. The RF breakdown performance is affected by the voltage divider action of $C_1$ and the gate to source capacitance of $Q_2$.

With the FIG. 2 circuit, the voltage at the drain of $Q_2$ can increase substantially, for both Class A and B amplifiers utilizing the DMC cell. In the case of Class A operation, since the breakdown voltage is 20 volts and the pinchoff voltage is $-3.5$ volts, the voltage existing at node 22 when $Q_1$ is shut off can be as high as 16.5 volts. Since the pinchoff voltage for $Q_2$ is $-3.5$ volts, in order for the operation of $Q_2$ to follow automatically from that of $Q_1$, $C_1$ can be selected to force node 26 to rise to 13 volts. The breakdown voltage at node 24 accordingly is raised to 33 volts. For Class B operation, since there is at node 22 13 volts ($V_B+2V_P$), 9.5 volts is required at node 28 to raise the breakdown voltage of $Q_2$ at node 24 to 29.5 volts. Thus, the performance of an amplifier stage using the DMC circuit of the instant invention is enhanced, irrespective of whether it is operating as a Class A or Class B amplifier stage.

FIGS. 4a through 4d illustrate how the DMC transfer function is affected by the size of a common source $Q_1$ FET stage. Note the small signal transconductance $g_m$ at 50% of the saturation current IDSS of $Q_2$ is that of $Q_1$, but the saturation current is set by $Q_2$. Thus, since $Q_2$ is capable of being turned fully on, the DMC is able to offer a high $g_m$ with low current, which is essential for the design of an efficient low noise amplifier (LNA). In addition, wide dynamic range is achieved because $Q_1$ can be loaded for high saturated power; and low noise figure results because $Q_1$ is forced to deliver both current gain and voltage gain.

For the four different cascode circuits represented by graphs 4a through 4d, it should be noted that each one of the common gate FETs has a gate width $W_2$ arbitrarily normalized to 1.0 mm, while each of the gate width $W_2$ of the common source FET varies. For example, FIG. 4a shows the DMC transfer curves whose $Q_1$ has a width $W_1$ of 1.5 mm; FIG. 4b a $W_1$ of 1 mm; FIG. 4c a $W_1$ of 2 mm; and FIG. 4d a $W_1$ of 2.5 mm. It should be appreciated that the FIG. 4b transfer curves actually are representative of a conventional cascode circuit since the width of the common source FET $Q_1$ is the same as the width of the common gate FET $Q_2$. On the other hand, the transfer curves shown in FIG. 4a are representative of the FIG. 2 circuit since $Q_1$ has a width of 1.5 mm.

With reference to FIG. 4b, it can be seen that the maximum current $I_D$ for $Q_2$ is approximately 0.375 amp while the $I_D$ of $Q_2$ of the FIG. 2 circuit is approximately 0.46 amp. Accordingly, it is clear that the DMC cell of the FIG. 2 circuit can provide for a much higher power output than a conventional cascode circuit. And since the slope of the $I_D$ of a conventional cascode circuit is less than that of a DMC cell (see FIGS. 4a, 4c and 4d), less transconductance $g_m$ is available for the conventional cascode circuit. Higher on resistance of the conventional cascode further degrades maximum power and efficiency.

These improved characteristics result in part from the voltage divider action of capacitor $C_1$ and the capacitance between the gate and drain of $Q_2$. Specifically, proper selection of $C_1$, such as with the value noted on the FIG. 2 circuit, gives rise to a set of desirable properties which include the reduction of the effective $g_m$ of $Q_2$, thereby forcing $Q_1$ to produce voltage gain because the input impedance of $Q_2$ is raised. Furthermore, capacitor $C_1$ represents a negative feedback or degeneration, which helps to stabilize the notoriously unstable common gate stage. It should be noted that the negative feedback between nodes 20, 22, and/or 24 can also be used to guarantee amplifier stability. Furthermore, by properly adjusting the value of $C_1$, when $Q_1$ is turned off, the gate to source voltage of $Q_2$ merely has to rise to its pinch off value such that $Q_1$ breaks down when $Q_2$ breaks down, per discussed above. Inductance can be introduced between $Q_1$ and $Q_2$ to improve high frequency performance.

Enhanced performance thereby results because the full on voltage of the DMC is only one-half to one (1) volt higher than that of a common source amplifier, while the breakdown voltage is increased by a factor of two (2) or more. Since the AC power is proportional to $V^2$, a higher load resistance is possible, power gain is enhanced, and the resulting power added efficiency (PAE) is dramatically improved. Furthermore, since $Q_1$ is now forced to become a power amplifier, it must dissipate a fair share of the DC power. Therefore, the resulting FET enhanced temperatures of a DMC are much lower than a comparable common source power stage because of the lower net thermal resistance. This aspect is important for reliability, stability and efficiency because $g_m$ and IDSS both drop with an increase in channel temperature.

Measured performance for a chip-and-wire implementation of a DMC whose $Q_1$ has a width of 2 mm and whose $Q_2$ has a width of 1 mm are given in FIGS. 5a through 5c. FIG. 5a shows the Class B operation of a 1.3 GHz one (1) watt amplifier utilizing the DMC; FIG. 5b shows a Class AB operation of the same amplifier; and FIG. 5c shows the Class B operation of a 4 GHz one (1) watt amplifier using a DMC.

The comparison between MIC and MMIC DMCs with conventional common source amplifier stages, in terms of the different parameters, is given in FIG. 6 with respect to both Class A and Class B operations. Given the same saturation current IDSS of 300 milli-amp (MA), the transconductance $g_m$ in milli-siemens (mS) for the common source stage is given as 75; for the DMC cell having a $Q_1$ gate width of 1.5 mm, the $g_m$ is 112 mS; and for a DMC cell having a $Q_1$ width of 2 mm, the $g_m$ is 150 mS.

In the column designating maximum drain voltage, it can be seen that for a Class A amplifier, a common source amplifier stage provides for 16 volts while the DMC stages provide for 32 volts. Likewise, for Class B operation, the common source amplifier stage provides for 12 volts maximum drain voltage while the DMC provides for 28.

The bias voltage $V_{DC}$ also presents a marked improvement for DMCs over common source amplifier stages. In Class A operation, the $V_{DC}$ for a common source stage is 9 while those for DMCs are 17.5. For Class B, the $V_{DC}$ for a common source stage is 7 while those for DMCs are 15.5.

The AC power PAC also substantially improves for DMCs over common source amplifier stages. As does the DC bias power PDC. Moreover, the efficiency EFF for DMCs also improves over the conventional cascode circuit. This in turn leads to an increased load impedance RL for the maximum power for DMCs over common source amplifier stages. The voltage gain AV which is a ratio of $V_D$ over $V_g$ for both Class A and B is also greater for DMCs. And as was discussed previously, the rise in temperature for FET junctions ($\Delta T_j$) is greater for the common source amplifier stage than the DMCs.

Returning to the FIG. 2 circuit, it can be seen that a tuning section 30 is added to the drain of $Q_2$, at node 24, to act as an amplifier. This insures that the voltage at node 24 can swing both above and below DC voltage such that if VD is 15 volts, a swing of about 25 $V_{AC}$ peak to peak be provided. The tuning circuit comprises an inductance L1 connected in parallel to a capacitor $C_3$ and a load impedance RL. The tuning circuit is grounded by means of bypass capacitor $C_4$. The voltage from voltage source $V_D$ is provided to node 28 by voltage divider $R_2$ and $R_3$. A RF bypass capacitor $C_2$ connects node 28 to ground. As was discussed previously, diode $D_1$ provides forward biasing to the gate of $Q_2$ and resistor $R_1$ is a leakage resistor which prevents charge buildup on capacitor $C_1$.

The present invention is subject to many variations, modifications and changes in detail. For example, as shown in FIG. 1f, which corresponds to FIG. 1d, the FETs $Q_1$ and $Q_2$ have been substituted for by transistors $Q'_{1T}$ and $Q'_{2T}$. As is well known and pointed out in the aforenoted '495 co-pending application, the substitution of FETs by BJTs is equally applicable for the present invention.

FIG. 1g is an illustration of a cascode circuit in which the input stage is comprised of two parallel-connected BJTs, $Q'_{10T}$ and $Q'_{11T}$, and an output stage comprising a BJT $Q'_{2T}$. But for the substitution of FETs by BJTs, the FIG. 1f and 1g circuits operate essentially in the same manner as the circuits of FIGS. 1d, and 1e, respectively.

Inasmuch as the present invention is subject to many variations, modifications and changes in detail (including replacing $Q_1$ with another type of transistor such as an NPN BJT, or an enhancement mode FET, etc.), it is intended that all matters described throughout this specification and shown in the accompanying drawings be interpreted as illustrative only and not in a limiting sense. Accordingly, it is intended that the invention be limited only by the spirit and scope of the appended claims.

I claim:
1. A cascode circuit comprising:
   an output FET;
   an input FET connected to said output FET, said input FET having a gate width sufficiently greater than the gate width of said output FET to ensure said input FET does not saturate when said output FET is fully turned on; and
   biasing means connected to the gate of said output FET to forward bias and thereby increase the breakdown voltage of said output FET.
2. The cascode circuit of claim 1, wherein said biasing means comprises:
   a diode having its cathode connected to the gate of said output FET and its anode connected to a RF bypass capacitor.
3. The cascode circuit of claim 2, further comprising: a capacitor connected in parallel to said diode to reduce the effective transconductance and thereby increase the input impedance of said output FET for increasing the breakdown voltage of said output FET; and
   a resistor connected in parallel to said capacitor.
4. The cascode circuit of claim 1, wherein said output FET and input FET are fabricated onto a single semiconductor substrate.
5. A cascode circuit comprising:
   a common gate stage having a predetermined gate width and breakdown voltage;
   a common source stage connected to said common gate stage and having a predetermined gate width whose size is sufficiently greater than the predetermined gate width of said common gate stage to prevent current saturation of said common source stage when said common gate stage is turned fully on;
   means for biasing said common gate stage to increase the breakdown voltage of said common gate stage to thereby enhance the operational characteristics of the cascode circuit.
6. The cascode circuit of claim 5, wherein said common gate and common source stages comprise respective discrete FETs, the drain of said common source stage FET being connected to the source of said common gate FET.
7. The cascode circuit of claim 5, wherein said biasing means comprises:
   diode means connected to the gate of said common gate stage to provide forward biasing thereof;
   capacitor means connected in parallel to said diode means to reduce the effective transconductance of said common gate stage and to ensure said common source stage does not break down before said common gate stage to thereby enable said common gate stage to provide maximum saturated output power; and
   resistor means connected in parallel to said diode and capacitor means.
8. The cascode circuit of claim 7, further comprising:
   RF bypass capacitor means connecting said capacitor means to ground; and
   voltage divider circuit means connected to said diode means to provide a forward biasing voltage to said common gate stage.
9. The cascode circuit of claim 5, wherein said common source stage and said common gate stage comprise respective FETs fabricated on the same semiconductor substrate, the width of the gate of said common source stage FET being sufficiently greater than the width of the gate of said common gate stage FET to ensure said common source stage FET does not saturate before said common gate stage FET saturates.
10. A cascode circuit comprising:
    an output FET;
    at least two input FETs connected in parallel and connected in turn to the output FET, said input FETs having a combined saturation circuit sufficiently greater than the saturation current of said output FET to ensure said input FETs do not saturate when said output FET is turned fully on; and
    biasing means connected to said output FET to provide forward biasing and increased breakdown voltage for said output FET.
11. The cascode circuit of claim 10, wherein said biasing means comprises:
    a diode connected in parallel to a capacitor and a resistor, said diode having its cathode connected to the gate of said output FET, the combination of connected in parallel diode, capacitor and resistor providing proper forward biasing to said output FET to enhance the performance of the cascode circuit.
12. A cascode circuit comprising:
    a common base stage having a first predetermined gate width and breakdown voltage;
    a common emitter stage connected to said common base stage and having a second predetermined gate width sufficiently greater than said first predetermined gate width to prevent said common emitter stage from current saturation when said common gate stage is turned fully on; and
    means for biasing said common base stage to increase its breakdown voltage to thereby enhance the operational characteristics of the cascode circuit.
13. The cascode circuit of claim 12, wherein said common base and common emitter stages comprise respective discrete transistors, the collector of said common emitter stage transistor being connected to the emitter of said common base stage transistor.
14. The cascode circuit of claim 12, wherein said biasing means comprises:
    diode means connected to the base of said common base stage to provide forward biasing thereof;
    capacitor means connected in parallel to said diode means to reduce the effective transconductance of said common base stage and to ensure said common emitter stage does not break down before said common base stage to thereby enable said common base stage to provide maximum saturated output power; and
    resistor means connected in parallel to said diode and capacitor means.

15. The cascode circuit of claim 14, further comprising:
 RF bypass capacitor means connecting said capacitor means to ground; and
 voltage divider circuit means connected to said diode means to provide forward biasing voltage to said common base stage.

16. The cascode circuit of claim 12, wherein said common emitter stage and said common stage are respective transistors fabricated on the same semiconductor substrate, the width of the base of said common emitter stage transistor being sufficiently greater than the width of the gate of said common base stage transistor to ensure said common emitter stage transistor does not saturate before said common base stage transistor saturates.

* * * * *

UNITED STATES PATENT AND TRADEMARK OFFICE
CERTIFICATE OF CORRECTION

PATENT NO. : 5,061,903

DATED : October 29, 1991

INVENTOR(S) : Carmine F. Vasile

It is certified that error appears in the above-identified patent and that said Letters Patent is hereby corrected as shown below:

Column 6, line 49, before "be" insert --can--.

Column 8, line 23, change "circuit" to --current--.

Column 9, line 9, after "common" (2nd occurrence) insert --base--.

Signed and Sealed this

Ninth Day of March, 1993

Attest:

STEPHEN G. KUNIN

Attesting Officer

Acting Commissioner of Patents and Trademarks